(12) United States Patent
Lo

(10) Patent No.: US 12,495,594 B2
(45) Date of Patent: Dec. 9, 2025

(54) SPACER STRUCTURES FOR SEMICONDUCTOR DEVICES

(71) Applicant: Taiwan Semiconductor Manufacturing Company, Ltd., Hsinchu (TW)

(72) Inventor: Yi-Chen Lo, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 552 days.

(21) Appl. No.: 17/662,284

(22) Filed: May 6, 2022

(65) Prior Publication Data

US 2023/0029651 A1     Feb. 2, 2023

Related U.S. Application Data

(60) Provisional application No. 63/227,484, filed on Jul. 30, 2021.

(51) Int. Cl.

| H10D 64/01 | (2025.01) |
|---|---|
| H10D 30/01 | (2025.01) |
| H10D 30/67 | (2025.01) |
| H10D 62/10 | (2025.01) |
| H10D 84/01 | (2025.01) |
| H10D 84/03 | (2025.01) |

(52) U.S. Cl.
CPC ......... *H10D 64/021* (2025.01); *H10D 30/031* (2025.01); *H10D 30/6713* (2025.01); *H10D 30/6735* (2025.01); *H10D 30/6757* (2025.01); *H10D 62/118* (2025.01); *H10D 84/0128* (2025.01); *H10D 84/013* (2025.01); *H10D 84/0147* (2025.01); *H10D 84/038* (2025.01)

(58) Field of Classification Search
CPC .......... H10D 30/6735; H10D 30/6757; H10D 62/121
See application file for complete search history.

(56) References Cited

U.S. PATENT DOCUMENTS

| 9,093,530 B2 | 7/2015 | Huang et al. |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

(Continued)

*Primary Examiner* — Eric A. Ward
(74) *Attorney, Agent, or Firm* — Sterne, Kessler, Goldstein & Fox P.L.L.C.

(57) ABSTRACT

The present disclosure describes a semiconductor device having a protection layer on inner spacer structures. The semiconductor device includes a nanostructure on a substrate. The nanostructure includes multiple semiconductor layers. The semiconductor device further includes a gate structure wrapped around a middle portion of the multiple semiconductor layers and a spacer structure adjacent to an end portion of the multiple semiconductor layers. The gate structure includes a high-k dielectric layer. The semiconductor device further includes a protection layer between the high-k dielectric layer and the spacer structure.

20 Claims, 16 Drawing Sheets

(56) References Cited

U.S. PATENT DOCUMENTS

| | | | |
|---|---|---|---|
| 2017/0069763 A1* | 3/2017 | Doris | H10D 30/024 |
| 2017/0110554 A1 | 4/2017 | Tak et al. | |
| 2017/0222006 A1* | 8/2017 | Suh | H01L 29/42392 |
| 2018/0315828 A1* | 11/2018 | Yamashita | H10D 62/118 |
| 2019/0006485 A1* | 1/2019 | Kim | H10D 30/024 |
| 2020/0365692 A1* | 11/2020 | Jung | H10D 30/62 |
| 2021/0043728 A1* | 2/2021 | Greene | H10D 64/017 |
| 2021/0210598 A1* | 7/2021 | Cheng | H10D 62/115 |
| 2021/0328013 A1* | 10/2021 | Ando | H10D 64/018 |
| 2021/0351276 A1* | 11/2021 | Bao | H01L 29/42392 |

* cited by examiner

SPACER STRUCTURES FOR SEMICONDUCTOR DEVICES

CROSS-REFERENCE TO RELATED APPLICATIONS

This application claims the benefit of U.S. Provisional Patent Application No. 63/227,484, titled "Hafnium Oxide Protecting Inner Spacer to Prevent Source/Drain Epi Damage in Gate-Ali- Around Approach," filed Jul. 30, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes and increased the difficulty of defects control in the semiconductor devices.

BRIEF DESCRIPTION OF THE DRAWINGS

Aspects of the present disclosure are best understood from the following detailed. description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
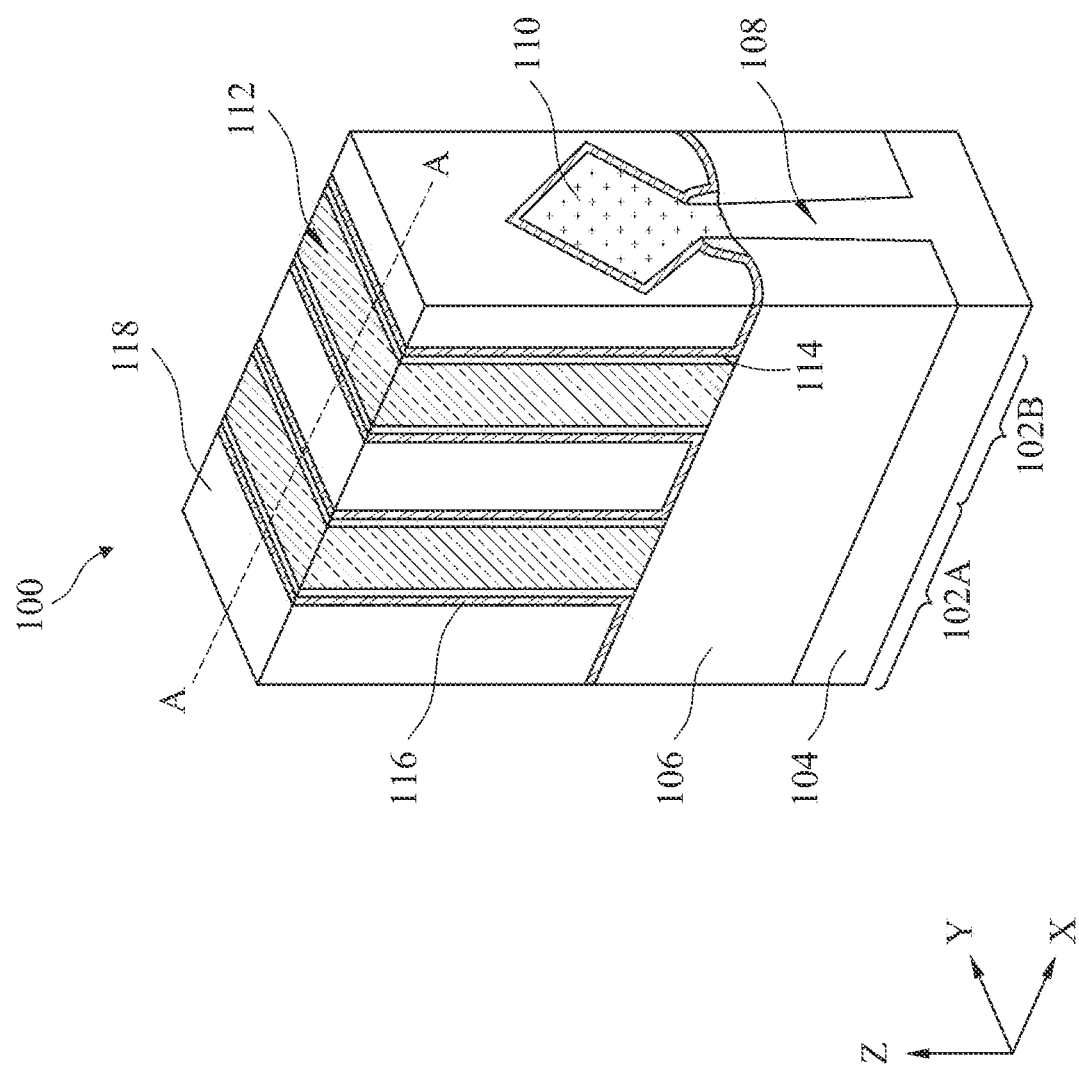
FIG. 1 illustrates an isometric view of a semiconductor device having a protection layer on inner spacer structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, %, ±5%, ±10%, ±20% of the value). These values are merely examples and are not intended to be limiting. The terms "about" and "substantially" can refer to a percentage of the values as interpreted by those skilled in relevant art(s) in light of the teachings herein.

With advances in semiconductor technology, multi-gate devices have been introduced in an effort to improve gate control by increasing gate-channel coupling, reducing off-state current, and reducing short-channel effects (SCEs). One such multi-gate device is the nanostructure transistor, which includes gate-all-around field effect transistor (GAA FET), nanosheet transistor, nanowire transistor, multi bridge channel transistor, nano-ribbon transistor, etc. The nanostructure transistor provides a channel in a stacked nanosheet/nanowire configuration. The GAA FET device derives its name from the gate structure that can extend around the channel and provide gate control of the channel on multiple sides of the channel. Nanostructure transistor devices are compatible with MOSFET manufacturing processes and their structure allows them to be scaled while maintaining gate control and mitigating SCEs.

With increasing demand for lower power consumption, higher performance, and smaller area (collectively referred to as "PPA") of semiconductor devices, nanostructure transistor devices can have their challenges. For example, during formation of the nanostructure channels (e.g. nanosheet, nanowire, nano-ribbon, etc.) of the nanostructure transistor devices, a mixture of etchant gases, such as hydrogen fluoride (HF) and fluorine ($F_2$), can remove sacrificial semiconductor layers to release the nanostructure channels. However, the mixture of etchant gases can etch through inner spacer structures between the sacrificial semiconductor layers and source/drain (S/D) epitaxial structures and thereby cause damage to the S/D epitaxial structures. The flow rates of HF and $F_2$ can be adjusted to avoid etching through the inner spacer structures. But the etchant gases with adjusted flow rates can cause germanium residues on the nanostructure channels, thereby increasing nanostructure channel surface roughness and reducing device performance.

Various embodiments in the present disclosure provide example methods for forming a protection layer on inner spacer structures of field effect transistors (PET) devices (e.g., GAA FETs) and/or other semiconductor devices in an integrated circuit (IC). The protection layer can prevent etching through inner spacer structures and damaging of the S/D epitaxial structures during formation of nanostructure channels of the FET devices. In some embodiments, the protection layer can include a high-k dielectric material, such as hafnium oxide, to protect the inner spacer structures. In some embodiments, the protection layer can reduce the damage to the S/D epitaxial structures by about 75% to about 95%. In some embodiments, the protection layer can improve device performance of the FET devices by about 5% to about 10%, compared to FET devices without a protection layer and using etchant gases with adjusted flow rates for the nanostructure formation.

Figure 2:
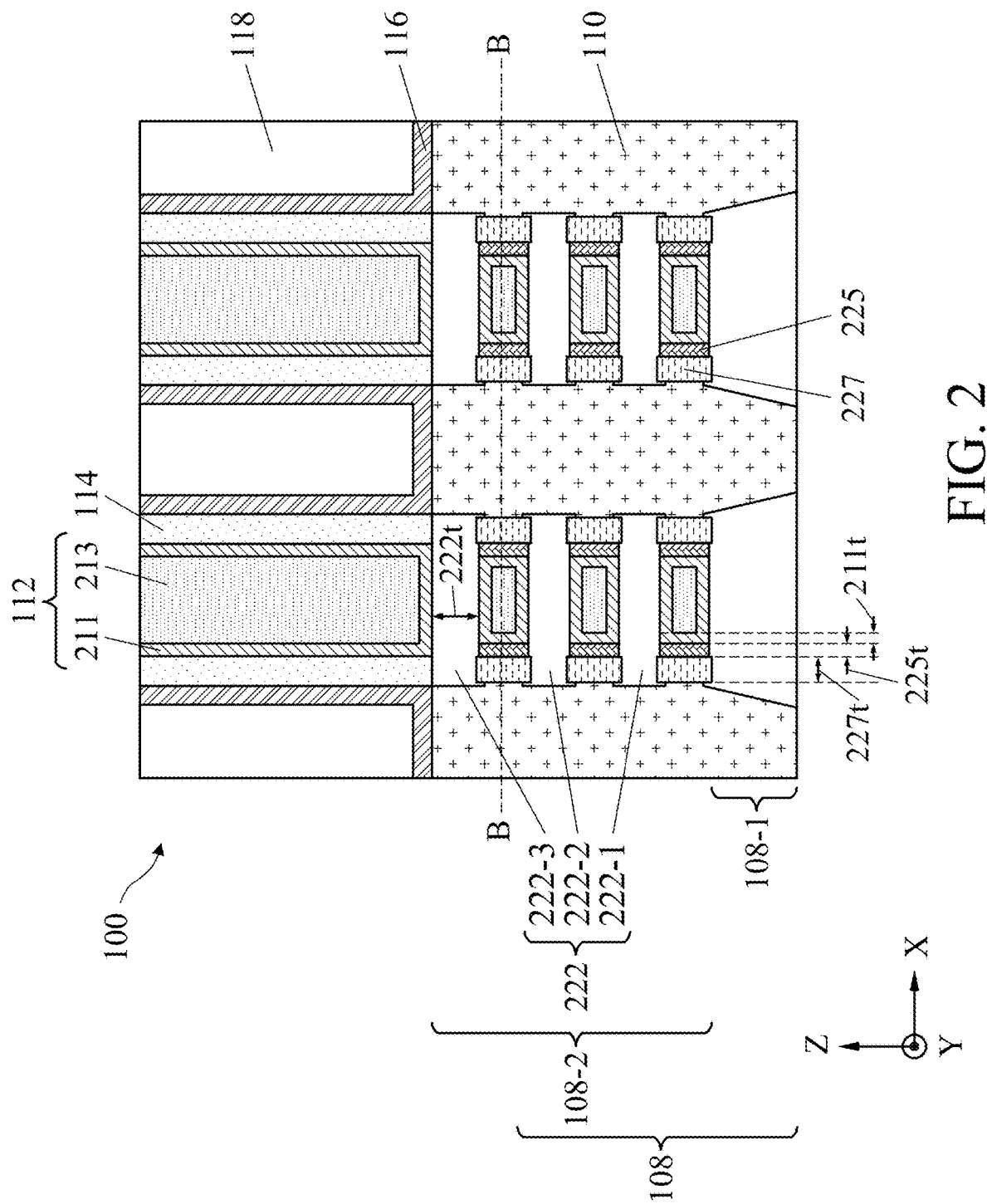
FIG. 2 illustrates a cross-sectional view of a semiconductor device having a protection layer on inner spacer structures, in accordance with some embodiments.
Figure 3:
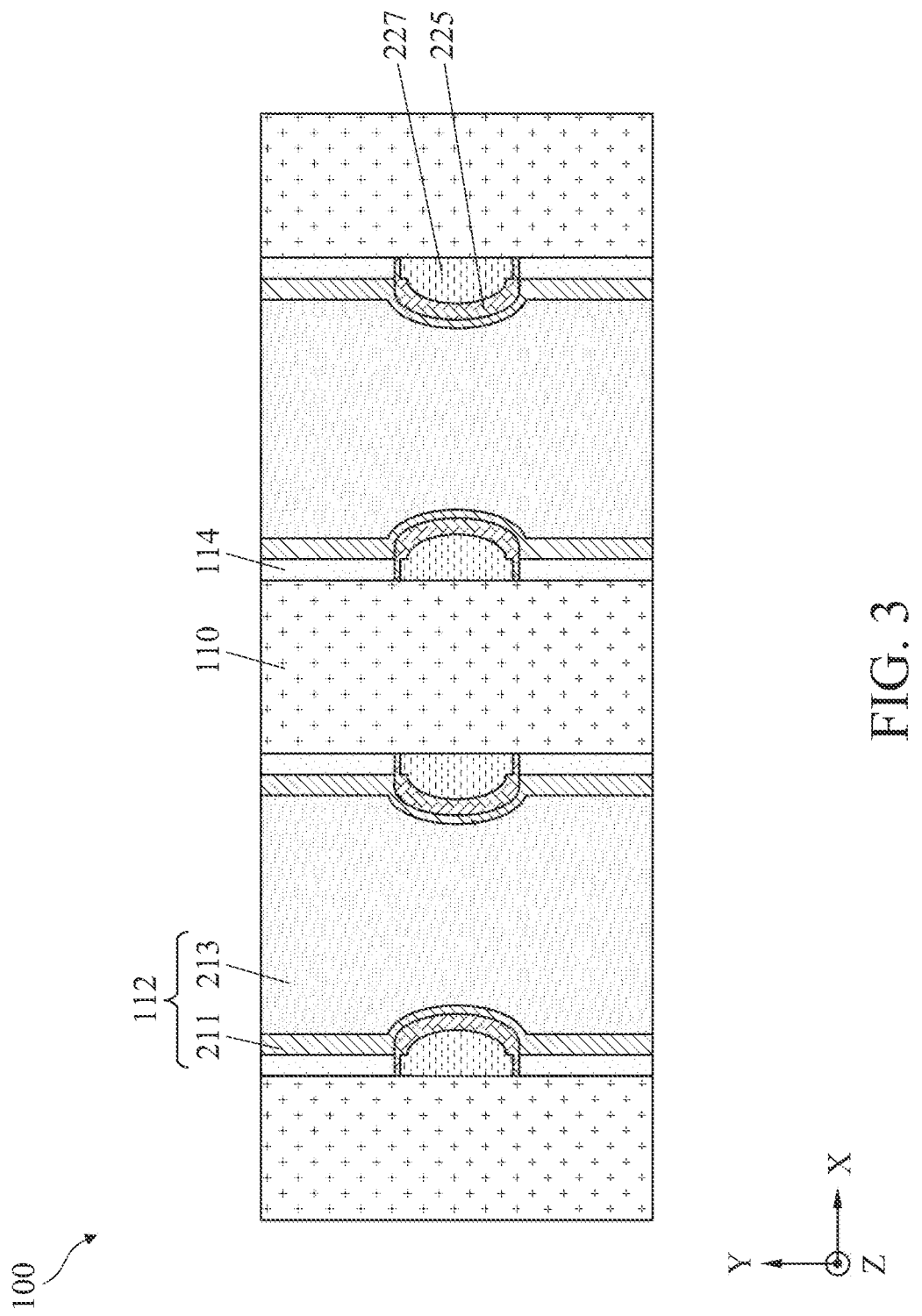
FIG. 3 illustrates a top-down view of a semiconductor device having a protection layer on inner spacer structures, in accordance with some embodiments.

FIG. 1 illustrates an isometric view of a semiconductor device 100 having a protection layer on inner spacer structures, in accordance with some embodiments, FIG. 2 illustrates a cross-sectional view of semiconductor device 100 along line A-A shown in FIG. 1, in accordance with some embodiments. Semiconductor device 100 can include nanostructure transistors 102A-102B. Semiconductor device 100 can have protection layer 225 on inner spacer structures 227. FIG. 3 illustrates a top-down view of semiconductor device 100 along line B-B shown in FIG. 2, in accordance with some embodiments. Referring to FIGS. 1-3, semiconductor device 100 having nanostructure transistors 102A-102B can be formed on a substrate 104 and can include nanostructures 108, shallow trench isolation (STI) regions 106, S/D structures 110, gate structures 112, gate spacers 114, etch stop layer (ESL) 116, interlayer dielectric (ILD) layer 118, protection layer 225, and inner spacer structures 227.

In some embodiments, nanostructure transistors 102A-102B can be both n-type nanostructure transistors (NFETs). In some embodiments, nanostructure transistor 102A can be an NFET and have n-type S/D structures 110. Nanostructure transistor 102B can be a p-type nanostructure transistor (PFET) and have p-type S/D structures 110. In some embodiments, nanostructure transistors 102A-102B can be both PFETs. Though FIGS. 1-3 show two nanostructure transistors, semiconductor device 100 can have any number of nanostructure transistors. In addition, semiconductor device 100 can be incorporated into an IC through the use of other structural components, such as contact structures, conductive vias, conductive lines, dielectric layers, passivation layers, and interconnects, which are not shown for simplicity. The discussion of elements of nanostructure transistors 102A-102B with the same annotations applies to each other, unless mentioned otherwise. And like reference numerals generally indicate identical, functionally similar, and/or structurally similar elements.

Referring to FIGS. 1-3, substrate 104 can include a semiconductor material, such as silicon. In some embodiments, substrate 104 includes a crystalline silicon substrate (e.g., wafer). In some embodiments, substrate 104 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 104 can be doped depending on design requirements (e.g., p-type substrate or n-type substrate). In some embodiments, substrate 104 can be doped with p-type dopants (e.g., boron, indium, aluminum, or gallium) or n-type dopants (e.g., phosphorus or arsenic).

STI regions 106 can provide electrical isolation between nanostructure transistors 102A-102B from each other and from neighboring nanostructure transistors (not shown) on substrate 104 and/or neighboring active and passive elements (not shown) integrated with or deposited on substrate 104. STI regions 106 can he made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure.

Referring to FIGS. 1-3, nanostructures 108 can be formed from patterned portions of substrate 104. Embodiments of the nanostructures disclosed herein may be patterned by any suitable method. For example, the nanostructures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the nanostructures.

As shown in FIGS. 1-3, nanostructures 108 can extend along an X-axis and through nanostructure transistors 102A-102B. Nanostructures 108 can include a bottom portion 108-1 on substrate 104 and a stacked portion 108-2 on bottom portion 108-1. In some embodiments, bottom portion 108-1 can include material similar to substrate 104. Bottom portion 108-1 can be formed from a photolithographic patterning and an etching of substrate 104. In some embodiments, stacked portion 108-2 can include a stack of semiconductor layers 222-1, 222-2, and 222-3(collectively referred to as "semiconductor layers 222"), which can be in the form of nanostructures, such as nanosheets, nanowires, and nano-ribbons. Each of semiconductor layers 222 can form a channel region underlying gate structures 112 of nanostructure transistors 102A-102B. In some embodiments, semiconductor layers 222 can include semiconductor materials similar to or different from substrate 104. In some embodiments, each of semiconductor layers 222 can include silicon. In some embodiments, each of semiconductor layers 222 can include silicon germanium. The semiconductor materials of semiconductor layers 222 cart be undoped or can be in-situ doped during their epitaxial growth process. Each of semiconductor layers 222 can have a thickness $222t$ along a Z-axis ranging from about 6 nm to about 15 nm. In FIGS. 1-3, nanostructures 108 under gate structures 112 can form channel regions of semiconductor device 100 and represent current carrying structures of semiconductor device 100. Though three layers of semiconductor layers 222 are shown in FIG. 2, nanostructure transistors 102A-102B can have any number of semiconductor layers 222.

S/D structures 110 can be disposed on bottom portion 108-1 and on opposing sides of stacked portion 108-2. SID structures 110 cart function as S/D regions of semiconductor device 100. In some embodiments, S/D structures 110 can have any geometric shape, such as a polygon, an ellipsis, and a circle. In some embodiments, S/D structures 110 can include an epitaxially-grown semiconductor material the same as the material of substrate 104. In some embodiments, the epitaxially-grown semiconductor material can include a material different from the material of substrate 104 and imparts a strain on the channel regions under gate structures 112. Since the lattice constant of such epitaxially-grown semiconductor material is different from the material of substrate 104, the channel regions are strained to advantageously increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D structures 110 can include silicon and can be in-situ doped during an epitaxial growth process using n-type dopants, such as phosphorus and arsenic. In some embodiments, S/D structures 110 can include silicon, silicon germanium, germanium, or III-V materials (e.g., indium antimonide, gallium antimonide, or indium gallium antimonide) and can be in-situ doped during an epitaxial growth process using p-type dopants, such as boron, indium, and gallium. In some embodiments, S/D structures 110 can include one or more epitaxial layers and each epitaxial layer can have different compositions.

Referring to FIGS. 1-3, gate structures 112 can be multi-layered structures and can wrap around middle portions of semiconductor layers 222 in stacked portion 108-2. In some embodiments, each of semiconductor layers 222 can be wrapped around by one of gate structures 112 or one or more layers of one of gate structures 112, in which gate structures 112 can be referred to as "gate-all-around (GAA) structures" and nanostructure transistors 102A and 102B can also be referred to as "GAA FETs 102A-102B."

As shown in FIGS. 2 and 3, each of gate structures 112 can include a gate dielectric layer 211 and a metal gate structure 213. In some embodiments, gate dielectric layer 211 can include an interfacial layer and a high-k dielectric layer. In some embodiments, gate dielectric layer 211 can include a high-k dielectric layer. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9). In some embodiments, the interfacial layer can include silicon oxide formed by a deposition process or an oxidation process. In some embodiments, the high-k dielectric layer can include hafnium oxide ($HFO_2$), zirconium oxide ($ZrO_2$), and other suitable high-k dielectric materials. As shown in FIGS. 2 and 3, gate dielectric layer 211 can wrap around each of semiconductor layers 222, and thus electrically isolate semiconductor layers 222 from each other and from conductive metal gate structure 213 to prevent shorting between gate structures 112 and semiconductor layers 222 during operation of nanostructure transistors 102A-102B. In some embodiments, gate dielectric layer 211 can have a thickness 211t ranging from about 10 Å to about 50 Å.

In some embodiments, metal gate structure 213 can include a work-function layer and a gate electrode. The work-function layer can wrap around semiconductor layers 222 and can include work-function metals to tune the threshold voltage ($V_t$) of nanostructure transistors 102A-102B. In some embodiments, the work-function layer can include titanium nitride, ruthenium, titanium aluminum, titanium aluminum carbon, tantalum aluminum, tantalum aluminum carbon, or other suitable work-function metals. In some embodiments, the work-function layer can include a single metal layer or a stack of metal layers. The stack of metal layers can include work-function metals having work-function values equal to or different from each other. The gate electrode can include titanium, tantalum, aluminum, cobalt, tungsten, nickel, ruthenium, and other suitable conductive materials. Depending on the spaces between adjacent semiconductor layers 222 and the thicknesses of the layers of gate structures 112, semiconductor layers 222 can be wrapped around by one or more layers of the gate structures 112 filling the spaces between adjacent semiconductor layers 222.

Referring to FIGS. 1-3, gate spacers 114 can be disposed on sidewalls of gate structures 112 and in contact with gate dielectric layer 211. Inner spacer structures 227 can be disposed adjacent to end portions of semiconductor layers 222 and between S/D structures 110 and gate structures 112, according to some embodiments. Gate spacers 114 and inner spacer structures 227 can include insulating materials, such as silicon oxide, silicon nitride, silicon oxynitride, carbonitride, silicon oxycarbide, silicon oxycarbonitride, a low-k material, and a combination thereof. In some embodiments, gate spacers 114 and inner spacer structures 227 can include a same insulating material. In some embodiments, gate spacers 114 and inner spacer structures 227 can include different insulating materials. Gate spacers 114 and inner spacer structures 227 can include a single layer or a stack of insulating layers. In some embodiments, gate spacers 114 and inner spacer structures 227 can have a low-k material with a dielectric constant less than about 3.9 (e.g., about 3.5, about 3.0, or about 2.8). In some embodiments, inner spacer structures 227 can have a thickness 227t ranging from about 4 nm to about 8 nm.

Protection layer 225 can be disposed between inner spacer structures 227 and gate dielectric layer 211 of gate structures 112, according to some embodiments. Protection layer 225 can protect inner spacer structures 227 and S/D structures 110 during the formation of nanostructure channels of semiconductor device 100. In some embodiments, protection layer 225 can include a dielectric material deposited by atomic layer deposition (ALD), chemical vapor deposition (CVD), and other suitable deposition methods. In some embodiments, protection layer 225 can have an etching rate less than an etching rate of inner spacer structures 227. An etch selectivity between inner spacer structures 227 and protection layer 225 can range from about 10 to about 50. As used herein, the term "etch selectivity" refers to the ratio of the etch rates of two materials under the same etching conditions. If the etch selectivity is less than about 10, inner spacer structures 227 and S/D structures 110 may be damaged during the formation of semiconductor layers 222. If the etch selectivity is greater than about 50, protection layer 225 may increase the parasitic capacitance between gate structures 112 and S/D structures 110. In some embodiments, protection layer 225 can include a high-k dielectric material, such as $HfO_2$ and $ZrO_2$. In some embodiments, both protection layer 225 and gate dielectric layer 211 can include $HfO_2$ and fluorine signals can be detected at an interface of protection layer 225 and gate dielectric layer 211 as a result of fluorine-contained etchants used during the formation of nanostructure channels.

In some embodiments, as shown in FIG. 2, protection layer 225 can have a thickness 225t ranging from about 1 Å to about 5 Å, less than thickness 211t of gate dielectric layer 211. In some embodiments, a first ratio of thickness 225t to thickness 227t of inner spacer structures 227 can range from about 0.02 to about 0.1. A second ratio of thickness 225t to thickness 211t can range from about 0.05 to about 0.3. If thickness 225t is less than about 1 Å, the first ratio is less than about 0.02, or the second ratio is less than about 0.05, protection layer 225 may not protect inner spacer structures 227 and S/D structures 110 during formation of nanostructure channels of semiconductor device 100. If thickness 225t is greater than about 5 Å, the first ratio is greater than about 0.1, or the second ratio is greater than about 0.3, protection layer 225 may increase the parasitic capacitance between gate structures 112 and S/D structures 110.

According to some embodiments, protection layer 25 can reduce the damage of S/D structures 110 by about 75% to about 95%. In some embodiments, the protection layer can improve device performance of the FET devices by about 5% to about 10%, compared to FET devices without a protection layer and using etchant gases with adjusted flow rates for the formation of nanostructure channels.

Referring to FIGS. 1 and 2, ESL 116 can be disposed on STI regions 106, S/D structures 110, and sidewalls of gate spacers 114. ESL 116 can be configured to protect STI regions 106, S/D structures 110, and gate structures 112 during the formation of S/D contact structures on S/D structures 110. In some embodiments, ESL 116 can include, for example, silicon oxide, silicon nitride, silicon oxynitride, silicon carbide, silicon carbonitride, boron nitride, silicon boron nitride, silicon carbon boron nitride, or a combination thereof.

ILD layer 118 can be disposed on ESL 116 over S/D structures 110 and STI regions 106. ILD layer 118 can include a dielectric material deposited using a deposition method suitable for flowable dielectric materials. For example, flowable silicon oxide can be deposited using flowable chemical vapor deposition (FCVD). In some embodiments, the dielectric material can include silicon oxide.

Figure 4:
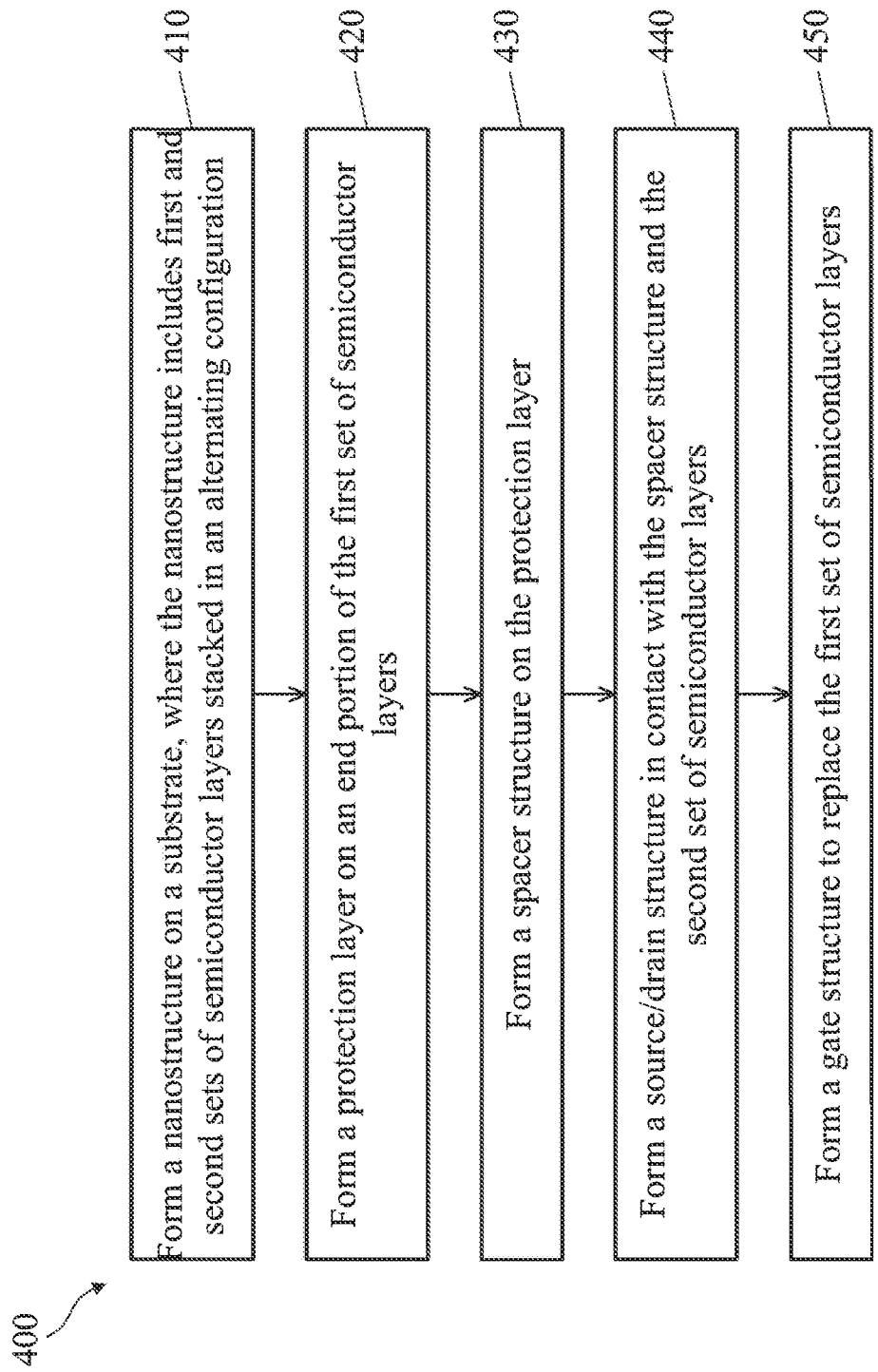
FIG. 4 is a flow diagram of a method for fabricating a semiconductor device having a protection layer on inner spacer structures, in accordance with some embodiments.

FIG. 4 is a flow diagram of a method 400 for fabricating semiconductor device 100 having protection layer 225 on inner spacer structures 227, in accordance with some embodiments. Method 400 may not be limited to nanostructure transistor devices and can be applicable to other devices that would benefit from protection layers on inner spacer structures. Additional fabrication operations may be performed between various operations of method 400 and may be omitted merely for clarity and ease of description. Additional processes can be provided before, during, and/or after method 400; one or more of these additional processes are briefly described herein. Moreover, not all operations may be needed to perform the disclosure provided herein. Additionally, some of the operations may be performed simultaneously or in a different order than shown in FIG. 4, In some embodiments, one or more other operations may be performed in addition to or in place of the presently described operations.

For illustrative purposes, the operations illustrated in FIG. 4 will be described with reference to the example fabrication process for fabricating semiconductor device 100 as illustrated in FIGS. 5-16. FIGS. 5-16 illustrate cross-sectional and top-down views of semiconductor device 100 having protection layer 225 on inner spacer structures 227 at various stages of its fabrication, in accordance with some embodiments. Elements FIGS. 5-16 with the same annotations as elements in FIGS. 1-3 are described above.

Figure 5:
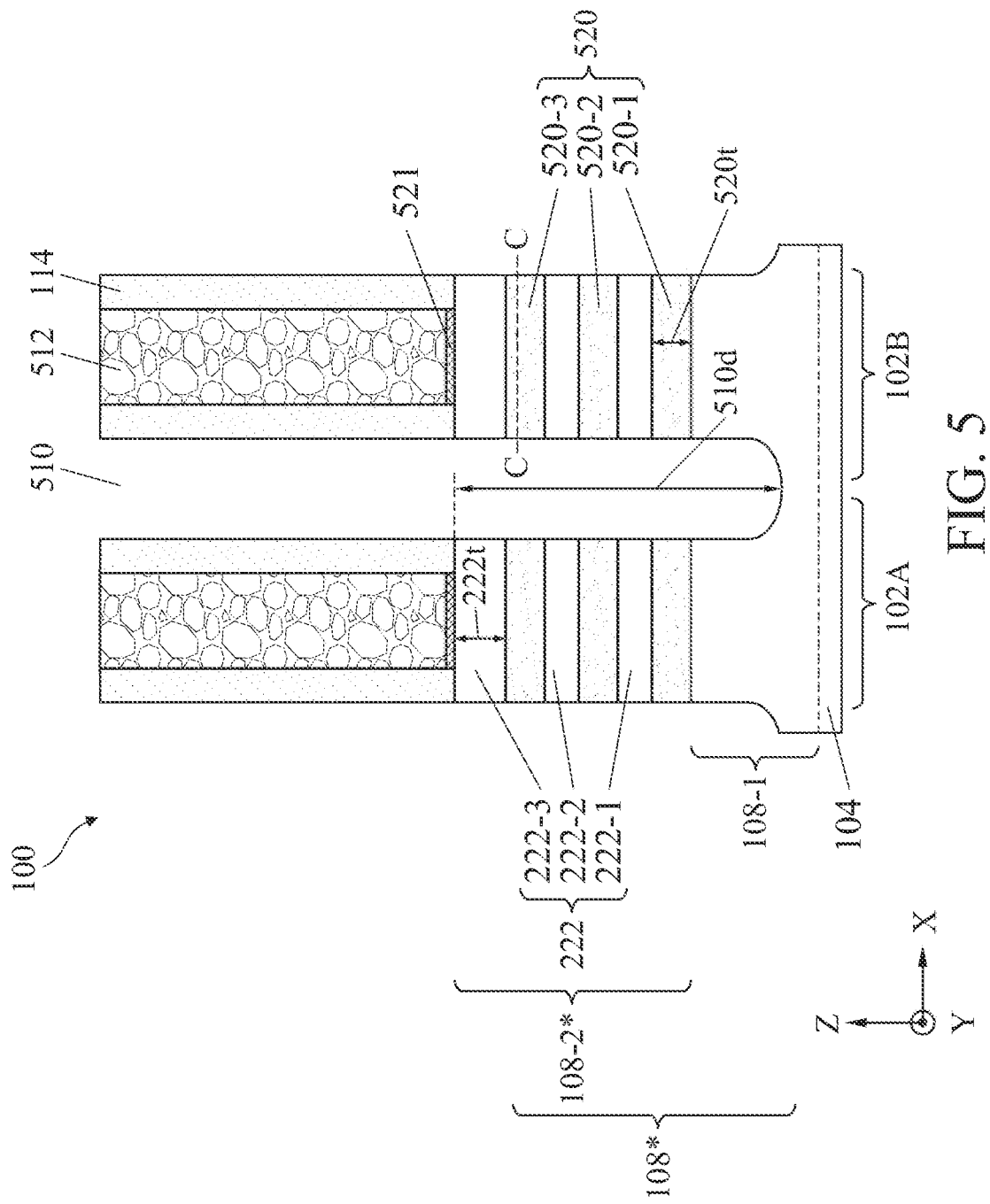
FIGS. 5-16 illustrate cross-sectional and top-down views of a semiconductor device having a protection layer on inner spacer structures, in accordance with some embodiments.
Figure 6:
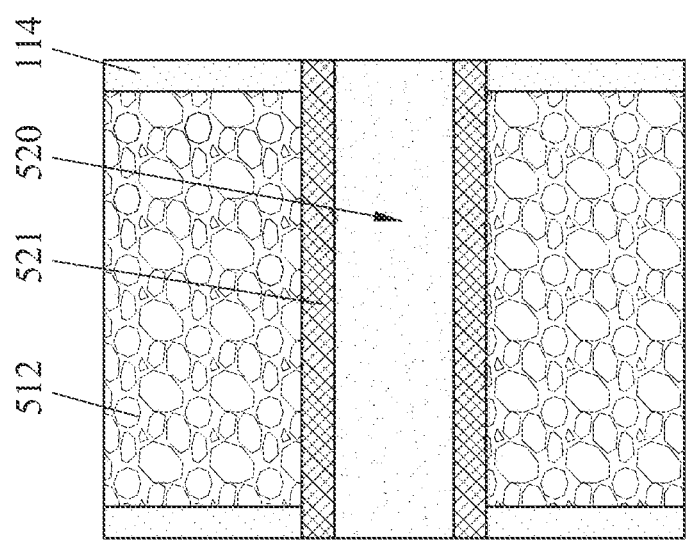
Figure 6:
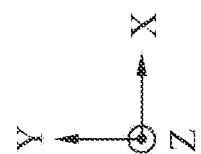

In referring to FIG. 4, method 400 begins with operation 410 and the process of forming a nanostructure including first and second semiconductor layers on a substrate. For example, as shown in FIG. 5, nanostructure 108* can be formed on substrate 104. Nanostructure 108* can include bottom portion 108-1 and stacked portion 108-2*. Stacked portion 108-2* can include first set of semiconductor layers 520-1, 520-2, and 520-3 (collectively referred to as "semiconductor layers 520") and second set of semiconductor layers 222. First and second sets of semiconductor layers 520 and 222 can be stacked in an alternating configuration. In some embodiments, first and second sets of semiconductor layers 520 and 222 can be epitaxially grown on substrate 104. In some embodiments, first set of semiconductor layers 520 can include a semiconductor material different from substrate 104, Second set of semiconductor layers 222 can include a semiconductor material same as substrate 104. In some embodiments, substrate 104 and second set of semiconductor layers 222 can include silicon. First set of semiconductor layers 520 can include silicon germanium. In some embodiments, substrate 104 and second set of semiconductor layers 222 can include silicon germanium. First set of semiconductor layers 520 can include silicon. In some embodiments, a germanium concentration in the silicon germanium can range from about 20% to about 50% to increase etch selectivity between first and second sets of semiconductor layers 520 and 222. In some embodiments, first set of semiconductor layers 520 can have a thickness 520t along a Z-axis ranging from about 3 nm to about 10 nm. Second set of semiconductor layers 222 can have a thickness 222t along a Z-axis ranging from about 6 nm to about 15 nm.

The formation of nanostructures 108 can be followed by formation of sacrificial gate structures 512, formation of gate spacers 114, and S/D region recess. Referring to FIG. 5, in some embodiments, sacrificial gate structures 512 can be formed by a blanket deposition of amorphous silicon or polysilicon followed by photolithography and etching of the deposited amorphous silicon or polysilicon. In some embodiments, an interfacial oxide layer 521 can be formed on nanostructures 108 prior to the formation of sacrificial gate structures 512. Interfacial oxide layer 521 can include silicon oxide, germanium oxide, or a combination thereof.

In some embodiments, gate spacers 114 can be formed by a blanket deposition of a dielectric material followed by a directional etch to keep the dielectric material on sidewall surfaces of sacrificial gate structures 512. In some embodiments, the dielectric material can include silicon oxide, silicon nitride, silicon oxynitride, silicon carbonitride, silicon oxycarbide, silicon oxycarbonitride, a low-k material, and a combination thereof.

In some embodiments, the S/D region recess can include a dry etch process performed at a temperature from about 40° C. to about 70° C. The dry etch process can be biased at a voltage from about 300 V to about 600 V. The dry etch process can include etchants, such as trifluoromethane ($CHF_3$), difluoromethane ($CH_2F_2$), fluoromethane ($CH_3F$), hydrofluoride (HCl), and hydroxylamine (HBr). The etchants can be carried by carrier gases, such as argon (Ar) and helium (He). In some embodiments, the dry etch process can etch a portion of the first and second sets of semiconductor layers 520 and 222 and can extend into bottom portion 108-1, as shown in FIG. 5. After the S/D region recess, an opening 510 can be formed in first and second sets of semiconductor layers 520 and 222. End portions of first and second semiconductor layers 520 and 222 can be exposed for subsequent processes. In some embodiments, opening 510 can have a recess depth 510*d* along a Z-axis from about 45 nm to about 55 nm.

Referring to FIG. 4, in operation 420, a protection layer is formed on an end portion of the first set of semiconductor layers. For example, as shown in FIGS. 6-10, protection layer 225 can be formed on end portions of first set of semiconductor layers 520. According to some embodiments, FIGS. 6-10 illustrate top-down views of semiconductor device 100 along line C-C shown in FIG. 5 at various stages of its fabrication. In some embodiments, the formation of protection layer 225 in FIGS. 6-10 can include laterally recessing first set of semiconductor layers 520, etching interfacial oxide layer 521, depositing a dielectric layer 925, and trimming dielectric layer 925.

Figure 7:
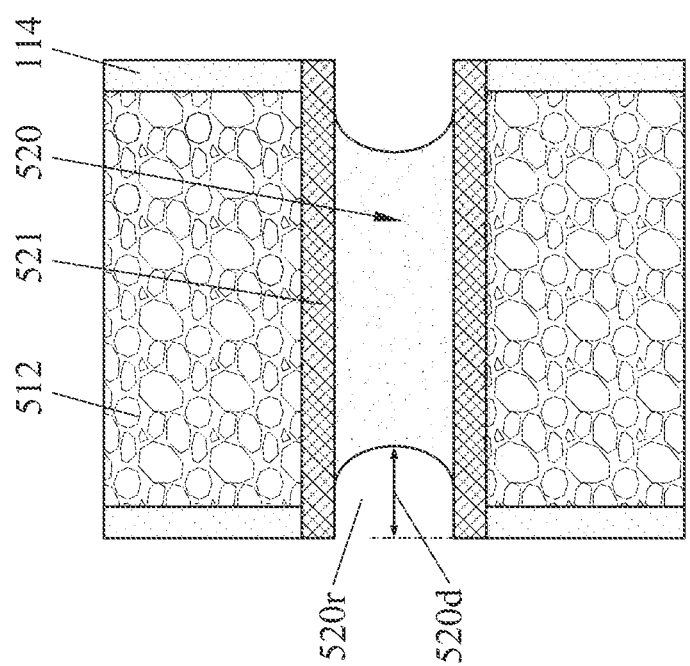
Figure 7:
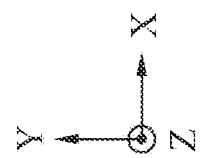

Referring to FIG. 7, first set of semiconductor layers 520 can be laterally recessed by a selective etching process, in accordance with some embodiments. The selective etching process can have a high etch selectivity between first set of semiconductor layers 520 and second set of semiconductor layers 222. In some embodiments, the selective etching process can include etchants, such as HF and $F_2$ gases, and can be performed at a temperature from about 0° C. to about 40° C. under a pressure from about 100 mTorr to about 1000 mTorr. In some embodiments, the selective etching process can include etchants, such as fluorine radical dissociated from nitrogen trifluoride, and can be performed at a temperature from about −10° C. to about 10° C. under a pressure from about 3 mTorr to about 1000 mTorr. After the selective etching process, end portions of first set of semiconductor layers 520 can be removed and first set of semiconductor layers 520 can be laterally recessed to form a recess 520*r* with a recess depth 520*d* ranging from about 4 nm to about 8 nm.

Figure 8:
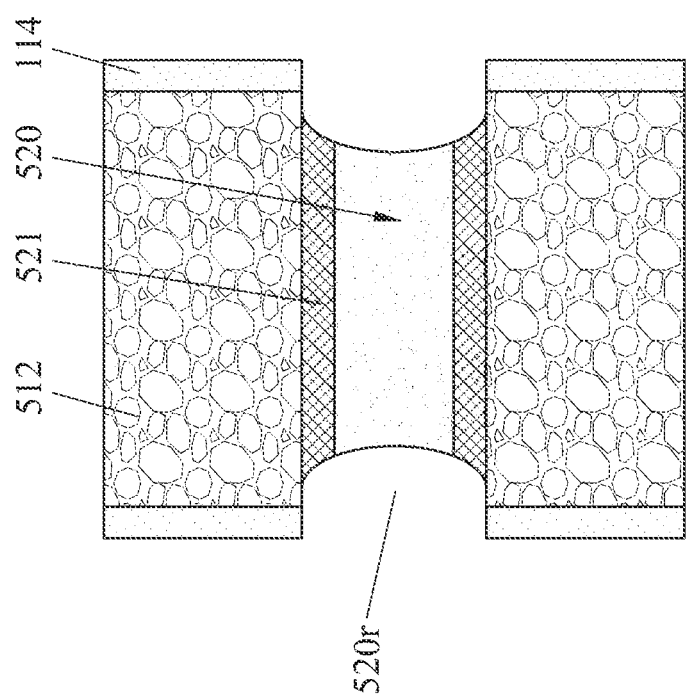

The lateral recess of first set of semiconductor layers 520 can be followed by etching interfacial oxide layer 521. For example, as shown in FIG. 8, interfacial oxide layer 521 adjacent to end portions of first set of semiconductor layers 520 can be etched to align with first set of semiconductor layers 520. In some embodiments, interfacial oxide layer 521 can be etched by a mixture of etchants, such as HF and ammonia ($NH_3$), at a temperature from about 20° C. to about 100° C. under a pressure from about 10 mTorr to about 4000 mTorr.

Figure 9:
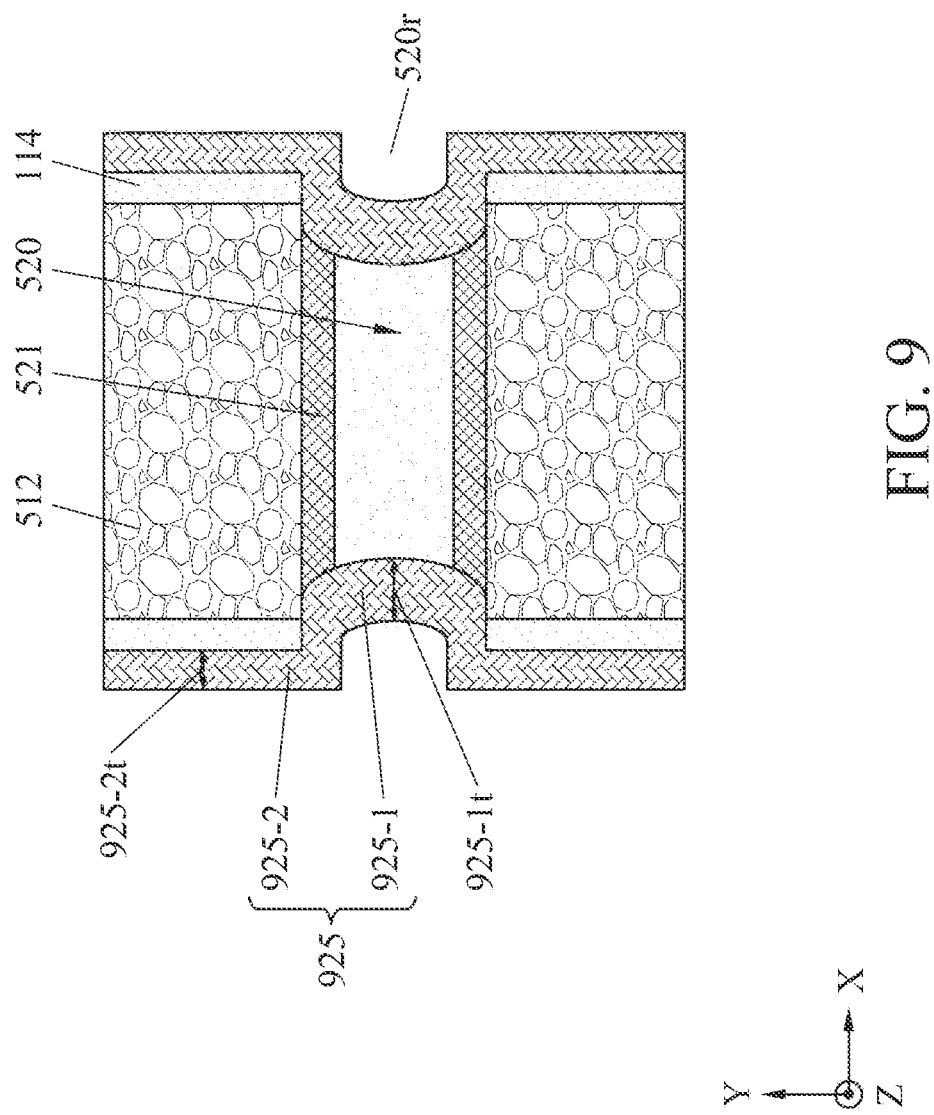

The etching of interfacial oxide layer 521 can be followed by deposition of dielectric layer 925. For example, as shown in FIG. 9, dielectric layer 925 can be blanket deposited on first and second sets of semiconductor layers 520 and 222 by ALD, CVD, and other suitable deposition methods. In some embodiments, dielectric layer 925 can include a high-k dielectric material, such as $HfO_2$ and $ZrO_2$. In some embodiments, dielectric layer 925 can include $HfO_2$ deposited using precursors, such as hafnium tetrachloride ($HfCl_4$) and water vapor ($H_2O$). Dielectric layer 925 can be deposited at a temperature from about 200° C. to about 400° C. under a pressure from about 1000 mTorr to about 3000 mTorr. In some embodiments, dielectric layer 925 can include a first portion 925-1 on end portions of first set of semiconductor layers 520 and a second portion 925-2 outside of recess 520*r* of first set of semiconductor layers 520. Due to the recess of first set of semiconductor layers 520, first portion 925-1 can have a thickness 925-1*t* greater than a thickness 925-2*t* of second portion 925-2. In some embodiments, thickness 925-1*t* can range from about 11 Å to about 25 Å, and thickness 925-2*t* can range from about 10 Å to about 20 Å.

Figure 10:
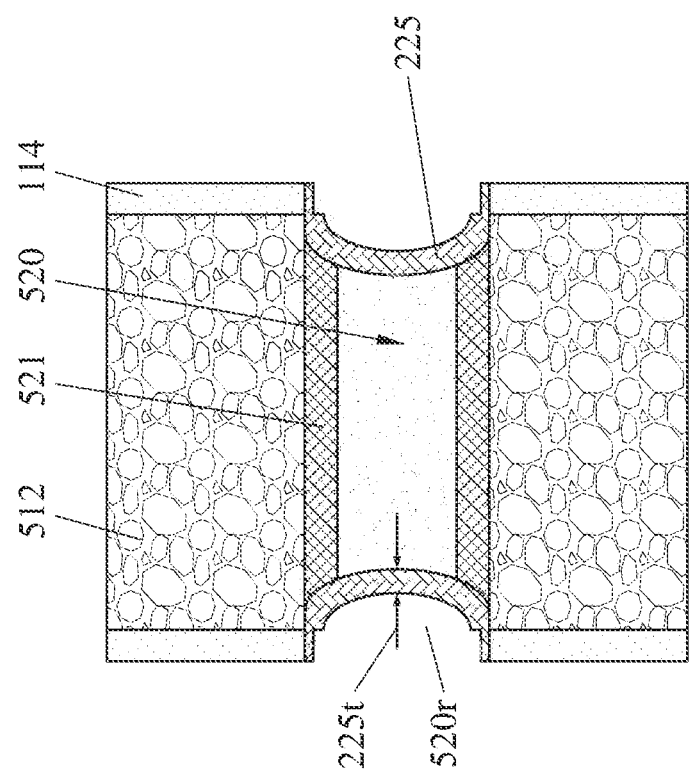

The deposition of dielectric layer 925 can be followed by trimming dielectric layer 925 to form protection layer 225. For example, as shown in FIGS. 9 and 10, dielectric layer 925 can be trimmed by an etching process to form protection layer 225. In some embodiments, the etching process can include etchants, such as boron trichloride ($BCl_3$). The etching process can be performed at a temperature from about 40° C. to about 100° C. under a pressure from about 10 mTorr to about 4000 mTorr for about 100 s to about 300 s. The trimming process can remove dielectric layer 925 from outside of recess 520*r* of first set of semiconductor layers 520 and form protection layer 225 on first set of semiconductor layers 520. In some embodiments, after the trimming process, protection layer 225 can have a thickness 225*t* ranging from about 1 Å to about 5 Å. If thickness 225*t* is less than about 1 Å, protection layer 225 may not protect subsequently-formed inner spacer structures 227 and S/D structures 110. If thickness 225*t* is greater than about 5 Å, protection layer 225 may increase the parasitic capacitance between subsequently-formed gate structures 112 and S/D structures 110.

In some embodiments, protection layer 225 can have an etching rate less than an etching rate of interfacial oxide layer 521 and first set of semiconductor layers 520. In some embodiments, an etch selectivity between first set of semiconductor layers 520 and protection layer 225 can range from about 10 to about 50. With a high etch selectivity from about 10 to about 50, protection layer 225 may not be etched during subsequent removal of first set of semiconductor layers 520.

Figure 11:
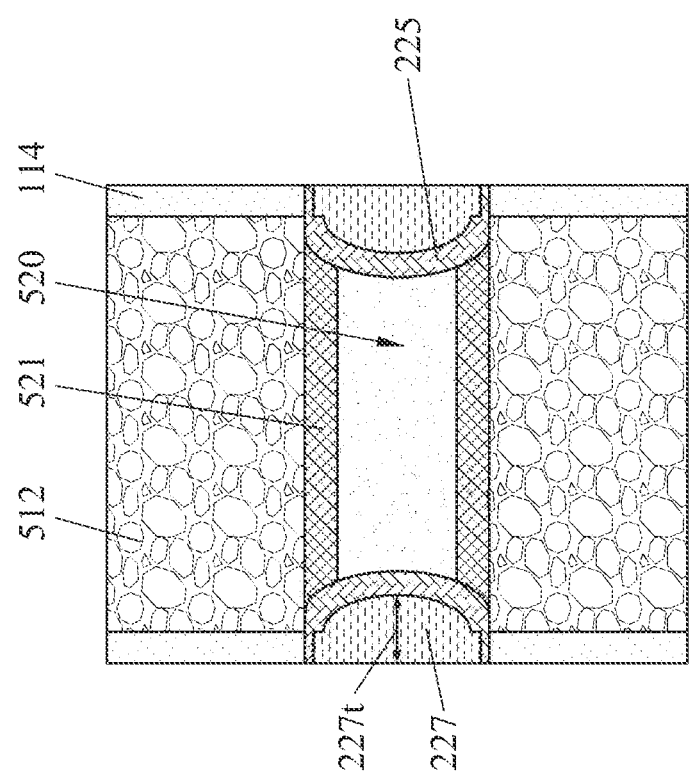

Referring to FIG. 4, in operation 430, a spacer structure is formed on the protection layer. For example, as shown in FIG. 11, inner spacer structures 227 can be formed on protection layer 225. The formation of inner spacer structures 227 can include deposition of a spacer layer on gate spacer 114 and protection layer 225 and trimming the spacer layer to form inner spacer structures 227. In some embodiments, the spacer layer can be blanket deposited on gate spacer 114 and protection layer 225 by ALD, CVD, and other suitable deposition methods. in some embodiments, the spacer layer can include insulating materials, such as silicon oxide, silicon nitride, silicon oxynitride, silicon carbonitride, silicon oxycarbide, silicon oxycarbortitride, a low-k material, and a combination thereof In some embodiments, the spacer layer can include a single layer or a stack of insulating layers. In some embodiments, the spacer layer can have a low-k material with a dielectric constant less than about 3.9.

The blanket deposition of the spacer layer can be followed by an etching process to remove the spacer layer outside of recess 520*r* of first set of semiconductor layers 520. In some embodiments, the etching process can include a mixture of etchants, such as HF and $NH_3$, and can be performed at a temperature from about 20° C. to about 100° C. under a pressure from about 10 miorr to about 4000 mTorr. After the etching process, the spacer layer in recess 520*r* of the first set of semiconductor layers 520 can remain and form inner spacer structures 227. In some embodiments, inner spacer structures 227 can have a thickness 227*t* ranging from about 4 nm to about 8 nm. In some embodiments, end portions of the second set of semiconductor layers 222 may be etched during the etching processes of forming inner spacer structures 227.

Figure 12:
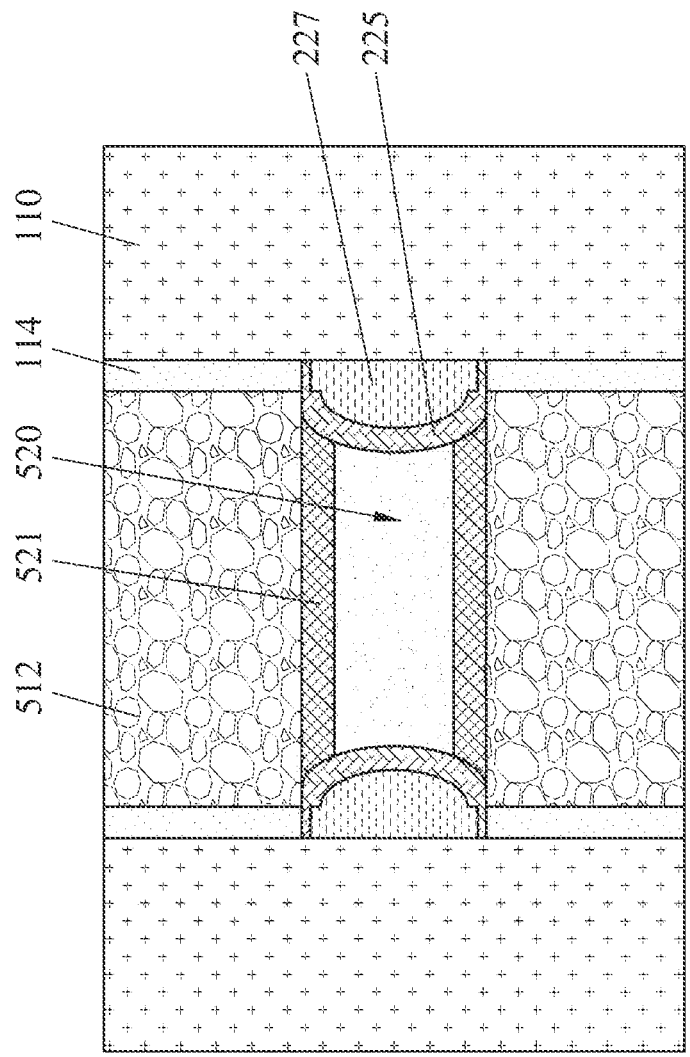

Referring to FIG. 4, in operation 440, a S/D structure is formed in contact with the spacer structure and the second set of semiconductor layers. For example, as shown in FIG. 12, S/D structures 110 can be formed on bottom portion 108-1 in contact with inner spacer structures 227 and second set of semiconductor layers 222. In some embodiments, S/D structures 110 can be epitaxially grown by (i) CVD, such as low pressure CVD (LPCVD), atomic layer CVD (ALCVD), ultrahigh vacuum CVD (UHVCVD), reduced pressure CVD (RPCVD), and other suitable CVD; (ii) molecular beam epitaxy (MBE) processes; (iii) any suitable epitaxial process; or (iv) a combination thereof. In some embodiments, S/D structures 110 can be grown by an epitaxial deposition/partial etch process, which repeats the epitaxial deposition/partial etch process at least once. Such repeated deposition/partial etch process can be referred to as a cyclic deposition-etch (CDE) process. The CDE process can reduce epitaxial defects formed during the growth and can control the profiles of S/D structures 110. In some embodiments, S/D structures 110 can include multiple epitaxial layers and can be in-situ doped with n-type or p-type dopants during the epitaxial growth process.

In some embodiments, S/D structures 110 can include silicon and can be in-situ doped during an epitaxial growth process using n-type dopants, such as phosphorus and arsenic. For n-type in-situ doping, n-type doping precursors, such as phosphine, arsine, and other n-type doping precursors, can be used. In some embodiments, S/D structures 110 can include silicon, silicon germanium, germanium, or III-V materials (e.g., indium antimonide, gallium antimonide, or indium gallium antimonide) and can be in-situ doped during an epitaxial growth process using p-type dopants, such as boron, indium, and gallium. For p-type in-situ doping, p-type doping precursors, such as diborane, boron trifluoride, and other p-type doping precursors, can be used. In some embodiments, each of the multiple epitaxial layers of S/D structures 110 can have different compositions, for example, different dopant concentrations and/or different germanium concentrations.

Figure 13:
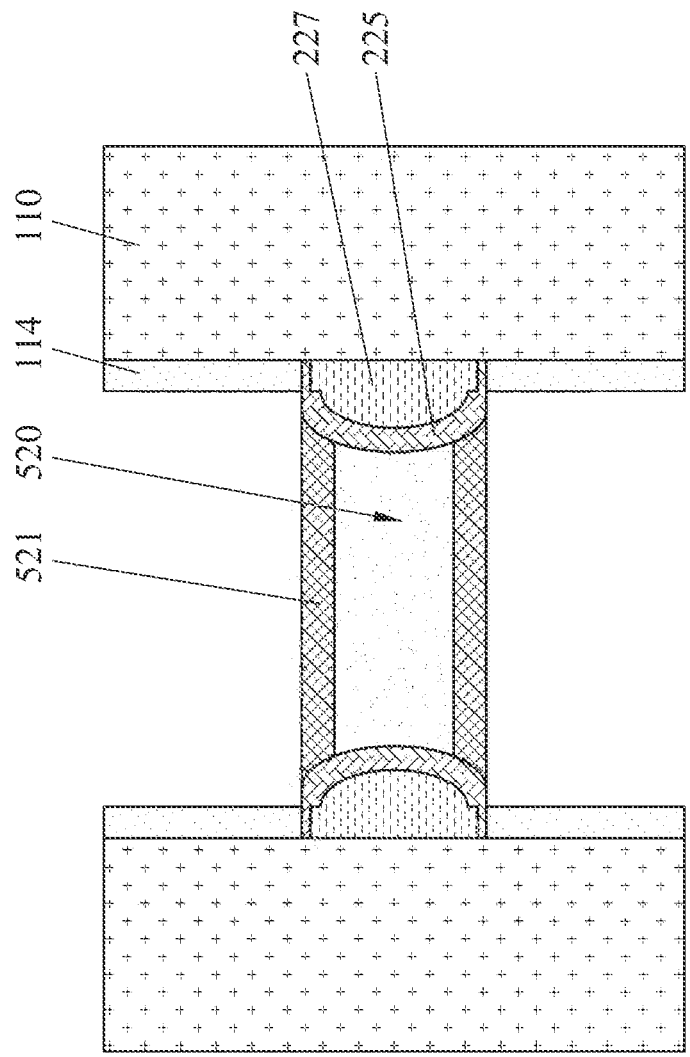
Figure 14:
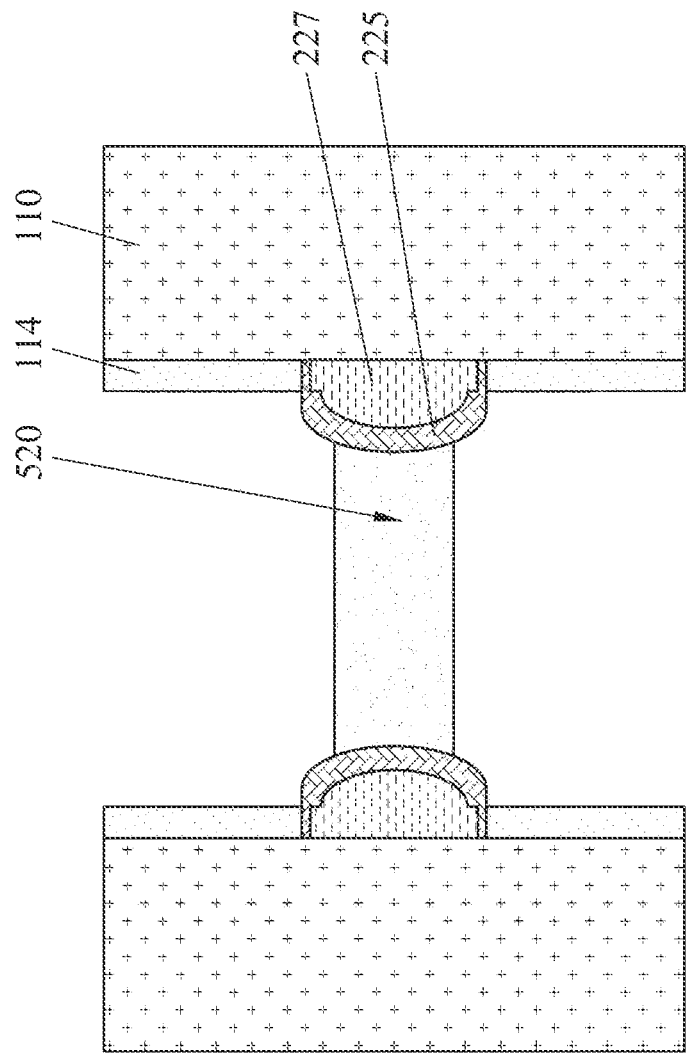
Figure 15:
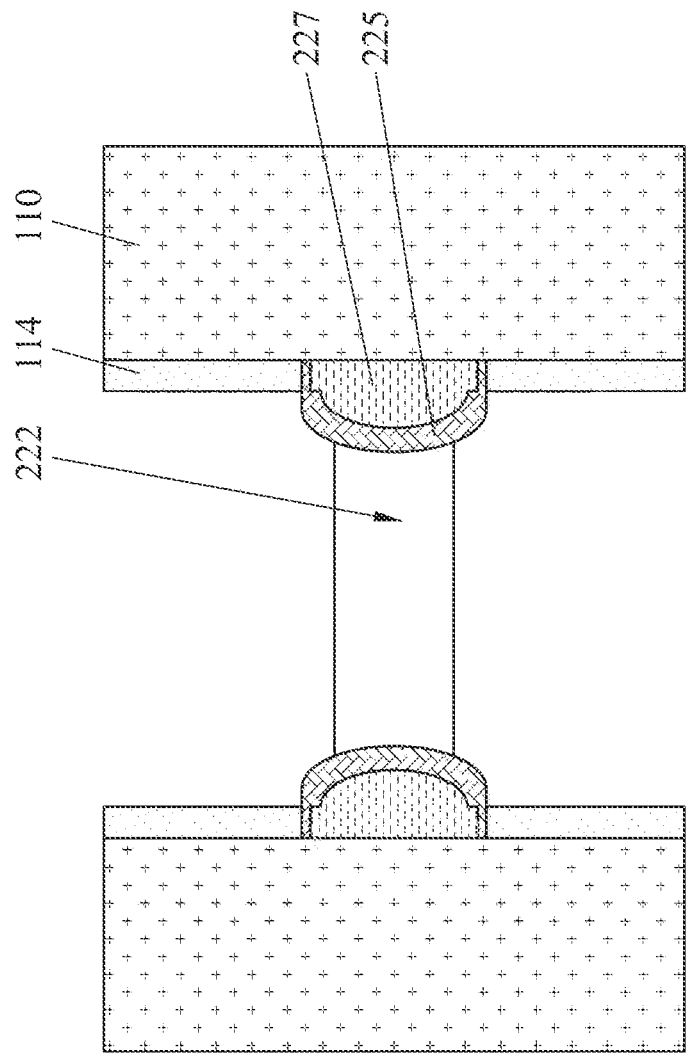
Figure 16:
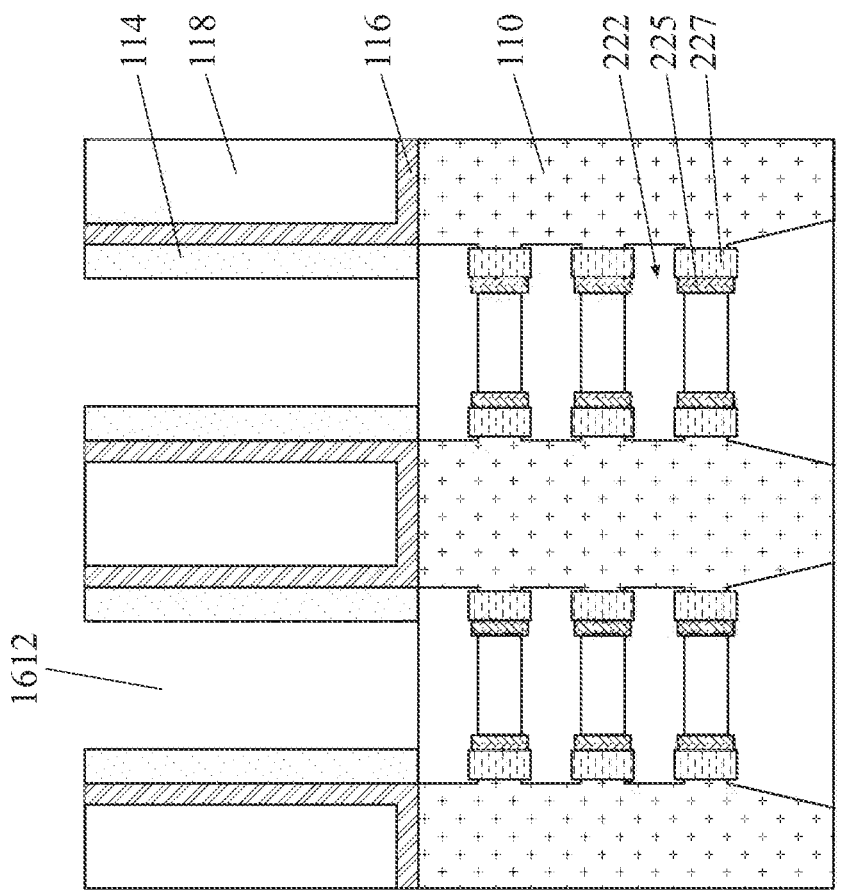

Referring to FIG. 4, in operation 450, a gate structure can be formed to replace the first set of semiconductor layers. For example, as shown in FIGS. 13-16 and 1-3, first set of semiconductor layers 520 can be removed and gate structures 112 can be formed wrapping around second set of semiconductor layers 222. In some embodiments, the formation of gate structures 112 can include removal of sacrificial gate structures 512 as shown in FIG. 13, removal of interfacial oxide layer 521 as shown in FIG. 14, removal of first set of semiconductor layers 520 as shown in FIGS. 15 and 16, and deposition of gate dielectric layer 211 and metal gate structure 213 as shown in FIGS. 1-3.

In some embodiments, sacrificial gate structures 512 can be removed in one or more etch processes. In some embodiments, the etch processes can include a dry etch process, a wet etch process, or other suitable etch processes to remove sacrificial gate structures 512 but not gate spacers 114 and interfacial oxide layer 521. In some embodiments, the etch process can include a wet etch process performed at a temperature from about 10° C. to about 70° C. The wet etch process can include etchants, such as HF, deionized water/ozone solution ($DIO_3$), potassium hydroxide (KOH), ammonium hydroxide (NH4OH), and tetramethylammonium hydroxide (TMAH). After the removal of sacrificial gate structures 512, interfacial oxide layer 521 can be exposed for subsequent etching processes, as shown in FIG. 13.

In some embodiments, interfacial oxide layer 521 can be removed by an etching process. The etching process can use a mixture of etchants, such as HF and ammonia ($NH_3$), at a temperature from about 20° C. to about 100° C. under a pressure from about 10 mTorr to about 4000 mTorr. After the removal of interfacial oxide layer 521, first set of semiconductor layers 520 can be exposed for subsequent etching processes, as shown in FIG. 14.

In some embodiments, first set of semiconductor layers 520 can be removed by a selective etching process. In some embodiments, first set of semiconductor layers 520 can have a higher etch selectivity than second set of semiconductor layers 222, gate spacers 114, and protection layer 225. In some embodiments, due to the high etch selectivity, the selective etch process may not remove protection layer 225 or second set of semiconductor layers 222 after removal of first set of semiconductor layers 520. Therefore, protection layer 225 can protect inner spacer structures 227 and prevent damage to S/D structures 110. In sonic embodiments, protection layer 225 can reduce the damage to S/D structures 110 by about 75% to about 95%.

In some embodiments, the selective etching process can include etchants, such as HF and $F_2$ gases, and can be performed at a temperature from about 0° C. to about 40° C. under a pressure from about 100 mTorr to about 1000 mTorr. In some embodiments, the selective etching process can include etchants, such as fluorine radical dissociated from nitrogen trifluoride, and can be performed at a temperature from about −10° C. to about 10° C. under a pressure from about 3 mTorr to about 1000 mTorr. After the selective etching process, first set of semiconductor layers 520 can be removed and openings 1612 can be formed above and around second set of semiconductor layers 222. Second set of semiconductor layers 222 and protection layer 225 can be exposed for subsequent processes. As fluorine-contained etchants are used for the selective etching process to remove first set of semiconductor layers 520, surfaces of protection layer 225 and second set of semiconductor layers 222 can have fluorine-contained residues. In some embodiments, as shown in FIG. 16, end portions of semiconductor layers 222 can have a thickness along a Z-axis less than a thickness of middle portions of semiconductor layers 222, because the end portions of semiconductor layers 222 may be etched during the formation of inner spacer structures 227.

Referring to FIGS. 1-3, gate structures 112 can be formed in openings 1612 and on second set of semiconductor layers 222. Gate structures 112 can wrap around semiconductor layers 222 and can control the channel current flowing through semiconductor layers 222. In some embodiments, the formation of gate structures 112 can include the formation of gate dielectric layer 211 and the formation of metal gate structure 213.

In some embodiments, the formation of gate dielectric layer 211 can include formation of an interfacial layer on semiconductor layers 222 and formation of a high-k dielectric layer on the interfacial layer and protection layer 225. The interfacial layer and high-k dielectric layer can wrap around each of semiconductor layers 222 and the high-k dielectric layer can be deposited on protection layer 225, as shown in FIGS. 2 and 3. In some embodiments, gate dielectric layer 211 can include a high-k dielectric layer formed on semiconductor layers 222 and protection layer 225. In some embodiments, both gate dielectric layer 211 and protection layer 225 can include the same high-k dielectric material. Because of protection layer 225 between gate structures I 12 and inner spacer structures 227, the high-k dielectric material around metal gate structures 213 that are disposed between semiconductor layers 222 can have different thicknesses along a Z-axis and an X-axis. For example, as shown in FIG. 2, the high-k dielectric material on metal gate structures 213 can have a thickness along a Z-axis less than a thickness along an X-axis of the high-k dielectric material between metal gate structures 213 and inner spacer structures 227. In some embodiments, gate dielectric layer 211 can have a thickness 211*t* greater than thickness 225*t*. In some embodiments, thickness 211*t* can range from about 10 Å to about 50 Å. Due to the fluorine-contained residues on surfaces of protection layer 225, after deposition of the high-k dielectric layer, fluorine signals can be detected at the interface of protection layer 225 and the high-k dielectric layer of gate dielectric layer 211. In some embodiments, protection layer 225 and gate dielectric layer 211 can both include $HfO_2$ and fluorine signals can be detected at the interface of two layers of $HfO_2$.

In some embodiments, the formation of metal gate structure 213 can include formation of one or more work-function layers and formation of a gate electrode. Depending on the spaces between adjacent semiconductor layers 222, one or more work-function layers and the gate electrode can fill the spaces between adjacent semiconductor layers 222. The formation of gate structures 112 can be followed by formation of gate contact structures, formation of S/D contact structures, formation of interconnects, and other processes, which are not described in detail for simplicity.

Various embodiments in the present disclosure provide example methods for forming protection layer 225 on inner spacer structures 227 of semiconductor device 100 (e.g., GAA FETS) and/or other semiconductor devices in an IC. Protection layer 225 can prevent etching through inner spacer structures 227 and damaging of S/D structures 110 during removal of first set of semiconductor layers 520 to form nanostructure channels of semiconductor device 100. In some embodiments, protection layer 225 can include a high-k dielectric material, such as $HfO_2$, to protect inner spacer structures 227. In some embodiments, protection layer 225 can reduce the damage to S/D structures 110 by about 75% to about 95%. In some embodiments, protection layer 225 can improve device performance of semiconductor device 100 by about 5 % to about 10%, compared to FET devices without a protection layer and using etchant gases with adjusted flow rates for the nanostructure formation.

In some embodiments, a semiconductor device includes a nanostructure on a substrate. The nanostructure includes multiple semiconductor layers. The semiconductor device further includes a gate structure wrapped around a middle portion of the multiple semiconductor layers and a spacer structure adjacent to an end portion of the multiple semiconductor layers. The gate structure includes a high-k dielectric layer. The semiconductor device further includes a protection layer between the high-k dielectric layer and the spacer structure.

In some embodiments, a method includes forming a nanostructure on a substrate. The nanostructure includes first and second sets of semiconductor layers stacked in an alternating configuration. The method further includes forming a protection layer on an end portion of the first set of semiconductor layers, forming a spacer structure on the protection layer, forming a source/drain structure in contact with the spacer structure and the second set of semiconductor layers, and forming a gate structure to replace the first set of semiconductor layers. The gate structure includes a high-k dielectric layer in contact with the protection layer.

In some embodiments, a method includes forming a nanostructure on a substrate. The nanostructure includes first and second sets of semiconductor layers stacked in an alternating configuration. The method further includes forming a first dielectric layer on end portions of the first set of semiconductor layers, forming a spacer structure on the first dielectric layer, forming a source/drain structure in contact with the spacer structure and the second set of semiconductor layers, forming a second dielectric layer on the first dielectric layer and the second set of semiconductor layers, and forming a metal gate structure on the second dielectric layer. The second dielectric layer is thicker than the first dielectric layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a nanostructure on a substrate, wherein the nanostructure comprises first and second sets of semiconductor layers stacked in an alternating configuration;
    forming a protection layer on an end portion of the first set of semiconductor layers;
    forming a spacer structure on the protection layer, wherein the spacer structure is in contact with the second set of semiconductor layers, and wherein the protection layer is in contact with the spacer structure and the first and second sets of semiconductor layers;
    forming a source/drain structure in contact with the spacer structure and the second set of semiconductor layers; and
    forming a gate structure to replace the first set of semiconductor layers, wherein the gate structure comprises a high-k dielectric layer in contact with the protection layer.

2. The method of claim 1, wherein the forming the protection layer comprises:
    etching the end portion of the first set of semiconductor layers;
    depositing a dielectric material on end portions of the first and second sets of semiconductor layers; and
    removing the dielectric material from the end portion of the second set of semiconductor layers.

3. The method of claim 1, further comprising etching an interfacial layer adjacent to the end portion of the first set of semiconductor layers prior to forming the protection layer.

4. The method of claim 1, wherein forming the gate structure comprises:
    removing the first set of semiconductor layers to expose the protection layer;
    depositing the high-k dielectric layer on the protection layer; and
    depositing a metal gate structure on the high-k dielectric layer.

5. The method of claim 1, wherein forming the gate structure comprises depositing the high-k dielectric layer on the protection layer.

6. The method of claim 1, further comprising etching the first and second sets of semiconductor layers to expose end portions of the first and second sets of semiconductor layers.

7. A method, comprising:
   forming a nanostructure on a substrate, wherein the nanostructure comprises first and second sets of semiconductor layers stacked in an alternating configuration;
   forming a first dielectric layer on end portions of the first set of semiconductor layers;
   forming a spacer structure on the first dielectric layer and in contact with the second set of semiconductor layers, wherein the first dielectric layer is in contact with the spacer structure and the first and second sets of semiconductor layers;
   forming a source/drain structure in contact with the spacer structure and the second set of semiconductor layers;
   forming a second dielectric layer on the first dielectric layer and the second set of semiconductor layers, wherein the second dielectric layer is thicker than the first dielectric layer; and
   forming a metal gate structure on the second dielectric layer.

8. The method of claim 7, wherein forming the first dielectric layer comprises:
   etching the end portions of the first set of semiconductor layers;
   depositing a dielectric material on end portions of the first and second sets of semiconductor layers; and
   removing the dielectric material from the end portions of the second set of semiconductor layers.

9. The method of claim 7, further comprising etching an interfacial layer adjacent to the end portion of the first set of semiconductor layers prior to forming the first dielectric layer.

10. The method of claim 7, wherein forming the second dielectric layer comprises:
    removing the first set of semiconductor layers; and
    depositing a high-k dielectric material on the first dielectric layer and the second set of semiconductor layers.

11. The method of claim 7, wherein forming the metal gate structure comprises depositing a metal on the second dielectric layer.

12. The method of claim 7, further comprising etching the first and second sets of semiconductor layers to expose end portions of the first and second sets of semiconductor layers.

13. A method, comprising:
    forming first and second sets of semiconductor layers stacked in an alternating configuration;
    forming a recess at end portions of the first set of semiconductor layers;
    forming a protection layer in the recess;
    removing a portion of the protection layer between end portions of the second set of semiconductor layers;
    forming a spacer structure on a remaining portion of the protection layer in the recess, wherein the protection layer is in contact with the spacer structure and the first and second sets of semiconductor layers;
    growing a source/drain structure in contact with the end portions of the second set of semiconductor layers; and
    forming a gate structure to wrap around the second set of semiconductor layers, wherein:
    the gate structure comprises a high-k dielectric layer in contact with the protection layer; and
    the protection layer is between the high-k dielectric layer and the source/drain structure.

14. The method of claim 13, wherein the forming the protection layer comprises:
    depositing a high-k dielectric material in the recess and on the end portions of the second set of semiconductor layers; and
    removing the high-k dielectric material from the end portions of the second set of semiconductor layers.

15. The method of claim 13, wherein the forming the protection layer comprises depositing hafnium oxide in the recess.

16. The method of claim 13, wherein the forming the recess at the end portions of the first set of semiconductor layers comprises:
    removing the end portions of the first set of semiconductor layers; and
    removing an interfacial layer adjacent to the end portions of the first set of semiconductor layers.

17. The method of claim 13, wherein the forming the gate structure comprises:
    removing the first set of semiconductor layers to expose the protection layer;
    depositing the high-k dielectric layer on the protection layer and the second set of semiconductor layers; and
    depositing a metal gate structure on the high-k dielectric layer.

18. The method of claim 17, wherein the removing the first set of semiconductor layers comprises selectively etching the first set of semiconductor layers with fluorine-contained etchants.

19. The method of claim 13, wherein the protection layer and the high-k dielectric layer comprise a same high-k dielectric material.

20. The method of claim 13, wherein the forming the first and second sets of semiconductor layers comprises etching the first and second sets of semiconductor layers to expose the end portions of the first and second sets of semiconductor layers.

* * * * *